(12) United States Patent
Miers et al.

(10) Patent No.: US 11,243,032 B2
(45) Date of Patent: Feb. 8, 2022

(54) HEAT SINK DEVICES AND METHODS OF USING SUCH DEVICES FOR THERMAL MANAGEMENT

(71) Applicant: Purdue Research Foundation, West Lafayette, IN (US)

(72) Inventors: Collier Stephen Miers, Lebanon, IN (US); Amy Marie Marconnet, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 22 days.

(21) Appl. No.: 16/905,824

(22) Filed: Jun. 18, 2020

(65) Prior Publication Data

US 2020/0400386 A1    Dec. 24, 2020

Related U.S. Application Data

(60) Provisional application No. 62/863,156, filed on Jun. 18, 2019.

(51) Int. Cl.

| | |
|---|---|
| *F28F 1/02* | (2006.01) |
| *H05K 7/20* | (2006.01) |
| *H01L 23/367* | (2006.01) |
| *H01L 23/427* | (2006.01) |

(52) U.S. Cl.
CPC ............ *F28F 1/022* (2013.01); *H01L 23/367* (2013.01); *H01L 23/427* (2013.01); *H05K 7/2039* (2013.01)

(58) Field of Classification Search
CPC .... F28F 1/022; F28F 1/32; F28F 3/048; F28F 1/24; H05K 7/20336; H05K 7/20254; H05K 7/20936; H05K 7/2039; H01L 23/367; H01L 23/427; H01L 23/4275; F28D 20/021; F28D 20/023
See application file for complete search history.

(56) References Cited

U.S. PATENT DOCUMENTS

| | | | | |
|---|---|---|---|---|
| 10,043,732 | B1* | 8/2018 | Al Omari | ............ H01L 23/3736 |
| 2007/0041160 | A1* | 2/2007 | Kehret | ............... H05K 7/20445 |
| | | | | 361/704 |
| 2007/0186580 | A1* | 8/2007 | Kaplan | ....................... A23L 3/36 |
| | | | | 62/457.5 |
| 2007/0284092 | A1* | 12/2007 | Ghosh | .................. F28D 15/0233 |
| | | | | 165/104.33 |
| 2009/0321054 | A1* | 12/2009 | Qin | ........................ H01L 23/427 |
| | | | | 165/104.26 |
| 2010/0079941 | A1* | 4/2010 | Peng | ...................... H01L 23/467 |
| | | | | 361/679.52 |

(Continued)

*Primary Examiner* — Adam B Dravininkas
(74) *Attorney, Agent, or Firm* — Hartman Global IP Law; Gary M. Hartman; Domenica N. S. Hartman (57) ABSTRACT

Heat sink devices that use a phase change material (PCM) as a heat sink material, and methods of using such devices in thermal management applications. Such a heat sink device includes a base wall, a top wall spaced apart from the base wall, and an internal structure in intimate thermal and physical contact with the base wall and the top wall. The internal structure includes multiple compartments defined and separated by fins that extend between the base and top walls. At least one PCM is within the compartments and the fins serve as thermal enhancement structures to augment the surface area to volume ratio of the heat sink device.

19 Claims, 6 Drawing Sheets
(6 of 6 Drawing Sheet(s) Filed in Color)

(56) References Cited

U.S. PATENT DOCUMENTS

| | | | |
|---|---|---|---|
| 2011/0203777 A1* | 8/2011 | Zhao | B23P 15/26 165/104.26 |
| 2012/0263980 A1* | 10/2012 | Soukhojak | H01M 10/6563 429/50 |
| 2014/0060780 A1* | 3/2014 | Moon | F28D 15/046 165/104.21 |
| 2014/0157605 A1* | 6/2014 | Hsieh | A47G 23/0313 30/165 |
| 2015/0198380 A1* | 7/2015 | Haj-Hariri | F01D 5/187 62/3.2 |
| 2015/0257249 A1* | 9/2015 | Kim | H05K 1/0204 361/700 |
| 2017/0219294 A1* | 8/2017 | Longis | F28F 21/084 |

* cited by examiner

HEAT SINK DEVICES AND METHODS OF USING SUCH DEVICES FOR THERMAL MANAGEMENT

CROSS-REFERENCE TO RELATED APPLICATIONS

This application claims the benefit of U.S. Provisional Application No. 62/863,156, filed Jun. 18, 2019, the contents of which are incorporated herein by reference.

BACKGROUND OF THE INVENTION

The present invention generally relates to heat transfer devices and methods. The invention particularly relates to devices and methods that use a heat sink device containing a phase change material (PCM) for use in a wide variety of thermal management applications.

PCMs are attractive as passive thermal management solutions because they are compact, versatile, and use a phase change process to store thermal energy and smooth peak system thermal loads. PCM-based thermal management solutions are often well suited for maintaining proper operating conditions in situations and devices, such as but not limited to mobile (portable) electronic devices, where power requirements are critical and typical active thermal management strategies are precluded. With device power densities growing ever larger, static thermal management designs which target and design for worst case operating conditions are no longer favorable due to the high temperature swings during cycling, which can lead to component failure. In such situations, a PCM-based heat sink can absorb large power spikes and dissipate heat over a longer time scale to prevent overheating and damage to a device, permitting a system to be designed for an average load rather than peak/worst-case loading.

Since most portable electronic devices do not have sustained high loads, but rather short surges of high usage, PCMs are well suited for use to extend the time of peak operating power while keeping temperatures of these devices below critical levels. After a peak system load subsides, the PCM has time to dissipate this energy without impacting the perceived performance of the device. Implementation of PCMs within portable electronic devices helps to increase component reliability because temperature swings are smoothed and components no longer see the very high temperatures from the short heat surges due to computational sprinting.

Despite their usefulness, PCMs alone have some implementation roadblocks to overcome to enable their wide use as a primary thermal management solution for electronic devices. As a particular example, the use of PCMs has been somewhat limited due to the poor thermal properties of the materials. As such, much of the body of PCM research for thermal management addresses the issue of low thermal properties, specifically enhancement of PCM thermal conductivity.

One popular approach to enhance the thermal conductivity of PCMs is to integrate the PCM with high conductivity structures such as foams, wools, and honeycomb structures. Chintakrinda et al., "A direct comparison of three different material enhancement methods on the transient thermal response of paraffin phase change material exposed to high heat fluxes," International Journal of Thermal Sciences 50 (2011) 1639-1647, compared the effectiveness of three different thermal conductivity enhancers (aluminum foam, graphite foam, and graphite nanofibers) infiltrated with a paraffin wax, for heat fluxes from 1.9 to 11.6 W/cm$^2$. Similar to the heat spreading benefits of high-conductivity foams, metallic fins provide high conductivity pathways through a lower conductivity PCM with the added benefit of precise structure control and increased interfacial areas. Bentilla et al., "Research and development study on thermal control by use of fusible materials: Final Report," Technical Report, NASA, Hawthorne, Calif. (1966), compared the performance of metallic fillers (such as foams, wools, and honeycombs), finding honeycomb structures to be the most effective due to the continuous, regular, high conductivity structure, combined with large interfacial areas and small PCM thicknesses. This conclusion was echoed by Mahmoud et al., "Experimental investigation of inserts configurations and PCM type on the thermal performance of PCM based heat sinks, Applied Energy 112 (2013) 1349-1356, given the performance, light weight, and ease of implementation of a honeycomb core.

Another approach utilizes a heat sink or heat spreader design in which the PCM is integrated, thus effectively distributing heat throughout the PCM. Much research into PCM implementation for passive thermal management has involved finned heat sinks. Some studies concentrate on fin density, finding that increasing the number of pin fins is an effective way to enhance heat transfer to PCMs in high-power systems, while others target the fin shape to optimize the best interfacial shape to maximize heat transfer from the heat sink structure to the PCM. Gurrum et al., "Thermal Management of High Temperature Pulsed Electronics Using Metallic Phase Change Materials," Numerical Heat Transfer: Part A: Applications 42 (2002) 777-790, incorporated metallic PCM into microchannels and studied the impact of periodic power cycling, determining that the correlation between channel size and system performance was heavily dependent upon the thermal conductivity of the PCM. Krishnan et al., "A novel hybrid heat sink using phase change materials for transient thermal management of electronics," IEEE Transactions on Components and Packaging Technologies 28 (2005) 281-289, confirmed the conclusion reached by Bentilla et al. that long thin cavities for PCM provide better effectiveness for system cooling because there is a smaller depth of PCM through which the heat must conduct to fully access and utilize the complete volume of material for phase change.

Existing strategies utilizing high conductivity heat sink materials filled with a PCM typically rely on very simple and traditional geometries (typically parallel fins or pockets), which do not provide a tunable design to address specific problems and power maps encountered with high power density devices.

BRIEF SUMMARY OF THE INVENTION

The present invention provides heat sink devices that use a phase change material (PCM) as a heat sink material, and further provides methods of using such devices in a variety of thermal management applications.

According to one aspect of the invention, a heat sink device includes a base wall, a top wall spaced apart from the base wall, and an internal structure in intimate thermal and physical contact with the base wall and the top wall. The internal structure includes multiple compartments defined and separated by fins that extend between the base and top walls. At least one PCM is within the compartments and the fins serve as thermal enhancement structures to augment the surface area to volume ratio of the heat sink device.

Other aspects of the invention includes methods of using a device as described above as a heat sink for a heat load.

Other aspects and advantages of this invention will be appreciated from the following detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 1A and 1B represent sectional views of heat sink devices according to two nonlimiting embodiments of the invention. Both devices define multiple primary compartments that are arranged in a honeycomb-like architecture and contain one or more phase change materials (PCM). The device of FIG. 1B is larger than the device of FIG. 1 and further comprises a central heat spreader and multiple secondary compartments that surround the primary compartments and central heat spreader. In the sectional view of FIG. 1A a top wall that encloses the primary compartments has been entirely omitted, and in the sectional view of FIG. 1B a portion of a top wall that encloses the primary and secondary compartments has been omitted. The commonality of the primary compartments between the devices of FIGS. 1A and 1B and the optional inclusion of a central heat spreader and/or secondary compartments with the device of FIG. 1B enable heat sink devices within the scope of the invention to be sized and tuned for different sizes and types of heat-generating devices, for example integrated circuit chips, without impacting the mechanical infrastructure surrounding the devices. Local confinement of multiple separate volumes of PCM(s) within the primary and (if present) secondary compartments permits the PCM(s) to target different performance zones within the devices. The location of the primary compartments above the central heat spreader promotes heat spreading in high power regions of a heat-generating device.

FIG. 2 contains images of seven different heat sink devices that were evaluated. All of the evaluated devices were 5 mm thick and machined from 6061 aluminum. The three devices in the top row of FIG. 2 are 25×25 mm in area, and the four devices in the bottom row of FIG. 2 are 50×50 mm in area. The leftmost devices in both rows are solid with no compartments formed therein to contain a PCM, and were used as performance comparison benchmarks that provided sensible heating only. Each of the devices shown second from the left in the top and bottom rows has a single compartment formed therein to contain a PCM. Each of the devices shown third from the left in the top and bottom rows (hereinafter, referred to as an "isogrid" device) has multiple radial fins formed therein creating an isogrid (triangular-based) fin pattern to define multiple triangular-shaped primary compartments for containing a PCM. The rightmost device in the bottom row (hereinafter, referred to as an "isokite" device) has multiple radial and non-radial fins formed therein creating an isokite or deltoid (quadrilateral-based) fin pattern to define multiple deltoid-shaped primary compartments for containing a PCM, and additionally multiple radial fins formed therein creating a trapezoidal (quadrilateral-based) fin pattern to define multiple trapezoidal-shaped secondary compartments for containing a PCM.

FIG. 4 is a chart indicating the time for each evaluated heat sink device of FIG. 2 to reach a cut-off temperature of 95° C. The results are split and grouped first by device size (25×25 or 50×50 mm); then clustered by the type of PCM in the device during the test. A PCM type of "None" indicates a device was tested without any PCM, while "S70," "PT42," and "PT68" signify the use of the commercially-available PCMs PlusICE® S70 (melting temperature of 70° C.), PureTemp® 42 (melting temperature of 42° C.), and PureTemp® 68 (melting temperature of 68° C.), respectively. The heat sink device designs are identified as "Solid" for devices formed of a solid mass of aluminum with no compartments formed therein, "No Fins" for devices having a single compartment formed therein that contained a PCM, and "Isogrid" and "Isokite" for devices as identified in reference to FIG. 2 whose compartments contained a PCM. Each row of bar charts represents a different power level as indicated by the labels on the right hand side. The mass of PCM and the total mass of each device are listed below the bar charts.

FIG. 5 is a graph plotting time to 95° C. as a function of heat flux. As the heat flux was increased, the differences in performance between the device designs decreased. At a sufficiently high heat flux, the solid device provided approximately the same performance as the isogrid and isokite devices. The graphed lines serve to guide the eye and are not representative of mathematical fitting of the data.

DETAILED DESCRIPTION OF THE INVENTION

The following describes designs for tunable heat sink devices capable of use for passive thermal management of heat-generating devices, including but not limited to integrated circuit chips of electronic systems. The heat sink devices leverage high conductivity pathways formed by fins that are machined into a mass or body and serve as a heat sink, and compartments formed thereby that are sealed after being filled with a PCM.

Various aspects and advantages of this design will be appreciated from nonlimiting embodiments, investigations, etc., described below. During investigations leading to the present invention, experimental heat sink devices were developed and evaluated that contained multiple fins as internal thermal conductivity enhancement structures, which in turn defined internal closed passages or cavities (herein referred to as compartments) that contained at least one PCM such that the fins were surrounded by the PCM. The experimental heat sink devices were determined to extend the time to reach a selected cut-off temperature (e.g., 95° C.), in some cases by as much as 36.2% as compared to a solid (sensible heating only) heat sink of the same external dimensions. The experimental heat sink devices also weighed less than the solid heat sink, making the former an effective and advantageous thermal solution for a wide range of applications, including but not limited to mobile devices, aerospace platforms/vehicles, power electronics, and directed energy weapons. Additionally, some of the heat sink devices had a segmented configuration that lent themselves to customization and tuning for a specific size and/or type of heat-generating device or application.

Previous studies had indicated that honeycomb enhancement structures provide good thermal conductivity enhancement for PCMs. Whereas integrating metallic structures (e.g., foam, wool, or honeycomb) into a PCM has typically resulted in poor thermal contact with the exterior of a heat sink device, leading to large thermal resistances, the experimental heat sink devices reported below entail a monolithic integration of the heat sink device and thermal conductivity enhancement structures, eliminating contact problems associated with previous designs. The heat sink devices were responsive to sudden changes in heat input when the compartments filled with the PCM were narrow to promote the surface area that interfaces with the high-conductivity fins and walls of the heat sink device. These high aspect ratio compartments maximized the surface area to volume ratio between the PCM and thermal conductivity enhancement structures (fins) separating the compartments, leading to faster response times for the heat sink devices and their thermal management capabilities. Experimentally, two device sizes (25 and 50 mm) were evaluated with different internal compartment configurations (no fins, isogrid internal structures, and isokite internal structures) containing a PCM. The use of narrow compartments in combination with honeycomb patterns of enhancement structures subdivided into isogrid or isokite internal structures were determined to further augment the surface area to volume ratio beyond that studied with traditional honeycomb enhancements.

Figures 1A, 1B:
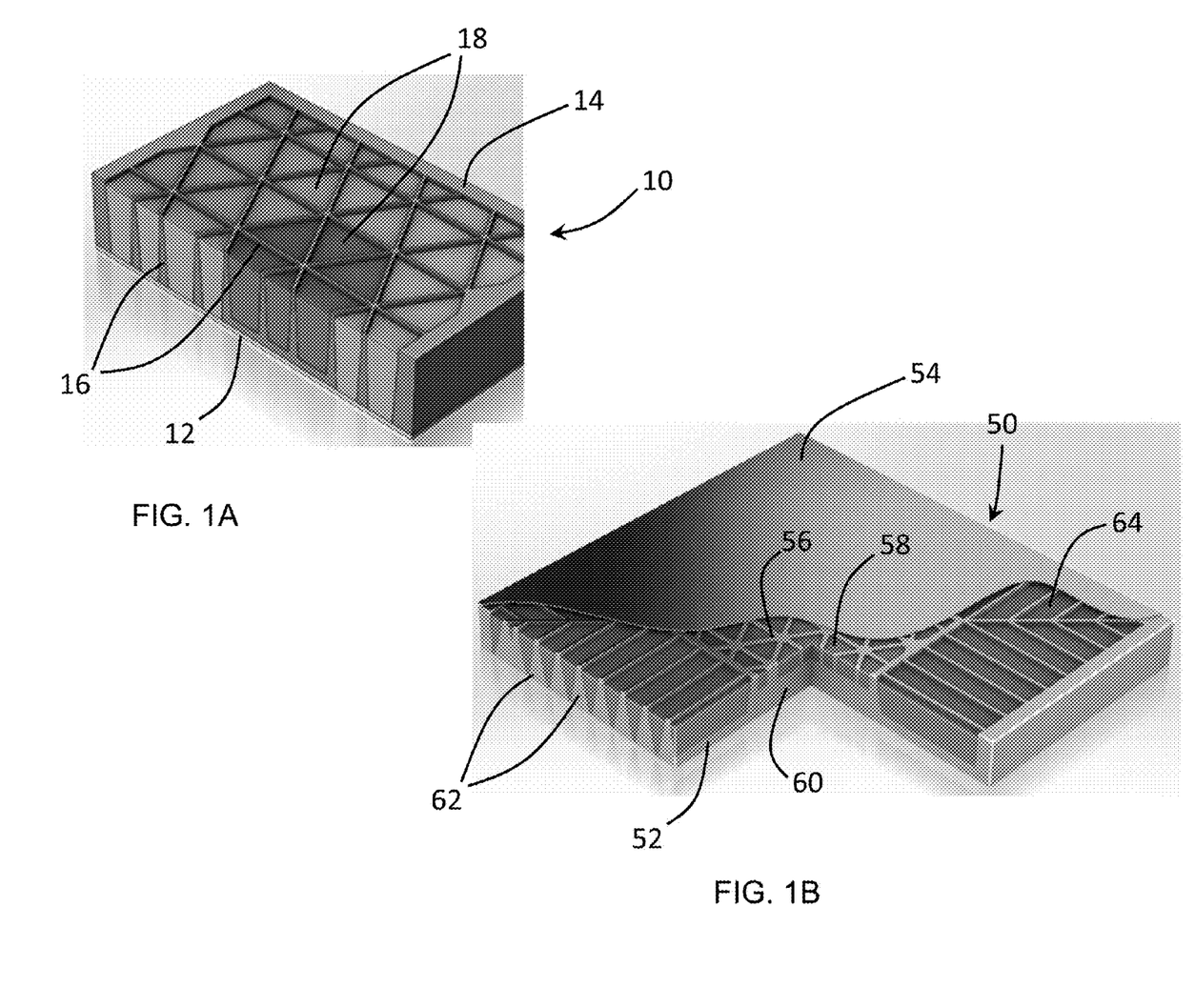

Two heat sink devices 10 and 50 that make use of an isogrid internal structure are represented in FIGS. 1A and 1B. Each device 10 and 50 has a base wall 12 and a second (top) wall 14 and 54 spaced apart from the base wall 12, between which their internal structures are defined and contained so that the internal structures are in intimate thermal and physical contact with both pairs of walls 12/14 and 52/54. The isogrid internal structures of both devices 10 and 50 comprise fins 16 and 56 that are arranged to define multiple primary compartments 18 and 58 that are schematically represented as containing one or more PCMs. The primary compartments 18 and 58 generally have triangular cross-sectional shapes when viewed from either wall 12/14 or 52/54, though other shapes are possible, such as isokite structures whose fins define compartments having quadrilateral (e.g., deltoid) cross-sectional shapes as described in reference to FIG. 2. The device 50 of FIG. 1B is larger than the device 10 of FIG. 1 and further comprises a central heat spreader 60 and internal structures comprising fins 62 that are arranged to define multiple secondary compartments 64 that surround the primary compartments 58 and central heat spreader 60. The commonality of the primary compartments 18 and 58 of the devices 10 and 50 and the optional inclusion of a central heat spreader 60 and/or secondary compartments 64 with the device 50 of FIG. 1B enable heat sink devices within the scope of the invention to be sized and tuned for different sizes and types of heat-generating devices, for example integrated circuit chips, without impacting the mechanical infrastructure surrounding the devices. As an example, establishing a heat sink device size early in the system level design allows optimization of the internal structure for specific power maps or thermal requirements of individual chip families.

Local confinement of multiple separate volumes of PCM(s) within the primary compartments 18 and 58 and (if present) the secondary compartments 64 permits the use of a PCM to target different performance zones within the devices 10 and 50, tailored for a particular heat load of a heat-generating device (not shown) to be cooled by the devices 10 and 50 as a result of placing their base walls 12 and 52 in thermal contact with the heat-generating device. The location of the primary compartments 58 above the central heat spreader 60 promotes heat spreading in high power regions of a heat-generating device. As such, a benefit of the heat sink design shown in FIG. 1A is that it can be customized for a given power dissipation map. Not all partitioned compartments within a device 10 or 50 need to be the same depth, filled with the same PCM, or have the same wall thicknesses. Compartments 18 and 58 with shallower depths (indicated by shading in FIGS. 1A and 1B) are advantageous for high-power density regions of chips because the resulting thicker region of the base wall 12 and 52 acts as a heat spreader. Additionally, the thickness of the base walls 12 and 52 can be increased in areas of high heat flux to promote enhanced local heat spreading. These techniques for localized heat spreading boost design performance without requiring all of the walls 12, 14, 52, and 54 or the entire base wall 12 or 52 of the device 10 or 50 to be thicker, which would significantly reduce the volume of PCM that can be placed in the compartments 18, 58, and 64. In an extreme case, where a region of heat flux is high enough that the PCM will not have time to change phase prior to the chip reaching the thermal cut-off temperature, a portion of the device 10 and 50 may be left as solid (no compartments), providing a continuous high conductivity path from the chip to the rejection surface formed by the top wall 14 or 54 of the device 10 or 50. This spreading path quickly removes heat from the chip surface while still providing the benefit of latent heat storage from the PCM in the remaining volume of the device 10 or 50. In addition to the design benefits of localized heat spreaders, the sizes and shapes of the compartments 18, 58, and 64 can be optimized to the specific power map of each application. As an example of this, the secondary compartments 64 of FIG. 1B are defined as troughs that extend away from the isogrid structure of the primary compartments 58 to promote uniform heat spreading throughout the device 50, while maximizing the total volume of PCM available for latent heat storage. Since the compartments 18, 58, and 64 are discrete, this also permits multiple PCMs to be employed within the same device 10 and 50 without concerns of mixing or sedimentation between materials.

Figure 2:
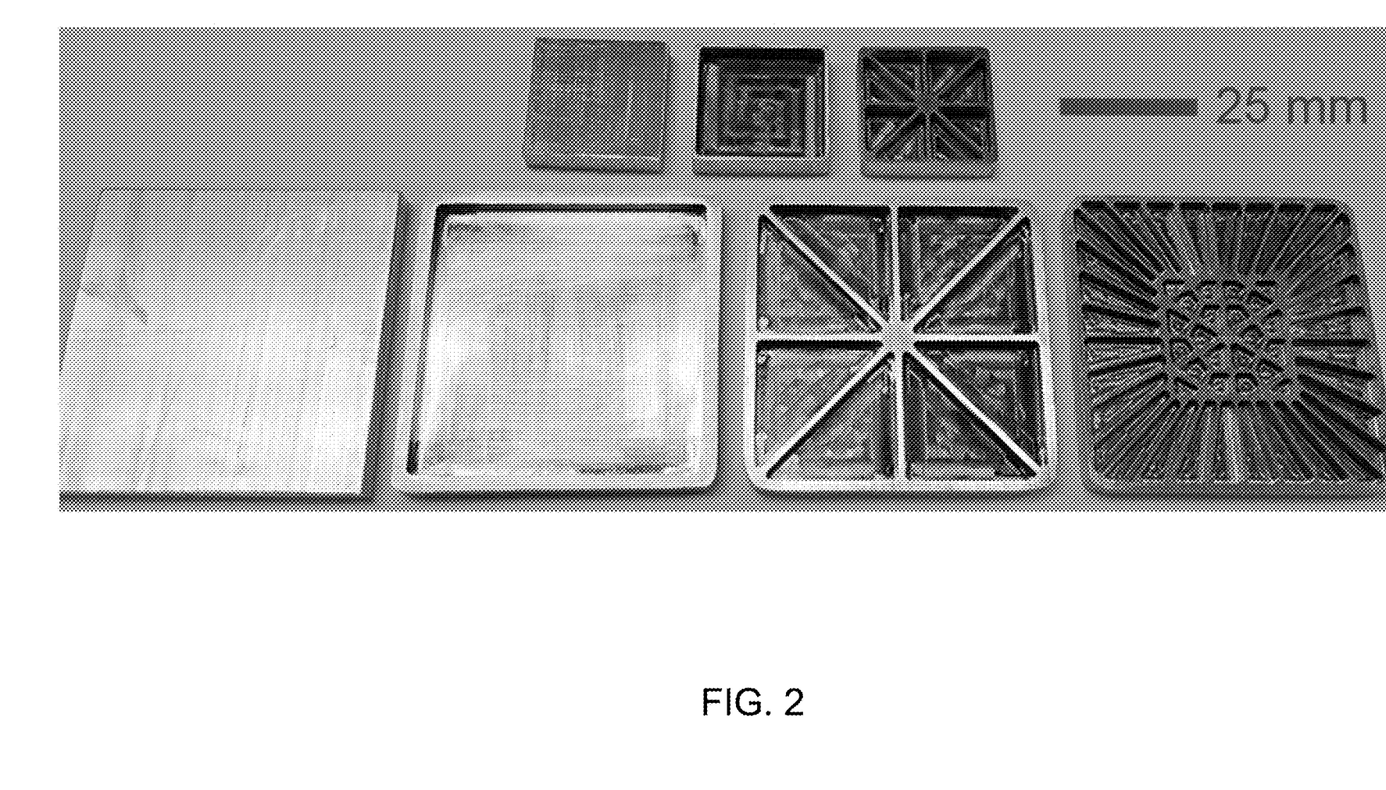

For the investigations leading to the present invention, seven heat sink devices were fabricated in two external sizes, as evident from FIG. 2. All evaluated devices had a thickness (between base and top walls) of 5 mm. The devices in the top row of FIG. 2 had areas of 25×25 mm, and the devices in the bottom row of FIG. 2 had areas of 50×50 mm. Each of the devices shown third from the left in the top and bottom rows of FIG. 2 are referred to herein as "isogrid" devices having multiple radial fins that created an isogrid (triangular-based) fin pattern to define multiple triangular-shaped primary compartments for containing a PCM. The rightmost device in the bottom row in FIG. 2 is referred to herein as an "isokite" device having multiple radial and non-radial fins that create an isokite or deltoid (quadrilateral-based) fin pattern to define multiple deltoid-shaped primary compartments for containing a PCM. This same device is also represented as having multiple radial fins that create a trapezoidal (quadrilateral-based) fin pattern to define multiple trapezoidal-shaped secondary compartments completely surrounding the primary compartments for containing an additional quantity of the same or different PCM. The devices were fabricated using a top-down approach to enable their high conductivity structures (fins) be machined or cast, then filled with PCM separately and sealed with their top wall. The PCM storage volumes of the resulting compartments were sized to permit easy introduction of PCM during the filling process. Other feature sizes (inner corner radii and wall thicknesses) were constrained by production tolerance limits and realizable feature sizes. For the investigations, the top walls were formed by a Kapton® film to prevent material degradation during testing and allow visual observation. However, it should be understood that top walls of other materials could be formed and attached, for example, by ultrasonic welding to permanently attach a metal top wall without overheating the PCM inside.

Numerous PCMs exist with a wide range of thermophysical properties. For the investigations, properties that were considered in the selection of the evaluated PCMs included melting temperature ($T_{melt,PCM}$), thermal conductivity (K), latent heat (L), heat capacity ($C_p$), and mass density ($\rho$). The selection of PCMs was first narrowed by targeting a specific range of operating temperatures. For the investigation, an operating temperature range of about 30 to 95° C. was chosen, and PCMs were chosen to have a melting point that fell within this range. The PCMs were also selected on the basis of having melting temperatures ($T_{melt,PCM}$) of around 70° C. to allow adequate time for melting while maintaining a sufficiently high phase transition point. This allowed regeneration to occur quickly, making the latent heat available for repeated cycle loading. A lower melting point PCM having a $T_{melt,PCM}$ of about 40° C. was also evaluated to investigate the impact this parameter might have on performance.

Final selection of the evaluated PCMs was based on the cooling figure of merit ($FoM_q$) of about $\kappa_l L_v$, where $\kappa_l$ is the thermal conductivity of the liquid phase and $L_v = \rho L$ is the volumetric latent heat. Relative rankings were used to select the following PCMs: PlusICE® S70, a high $FoM_q$ salt hydrate material commercially available from PCM Products Ltd and having a melting point of 70° C.; PureTemp® 68, a lower $FoM_q$ organic material commercially available from Puretemp LLC and having a melting temperature of 68° C.; and PureTemp® 42, a lower $FoM_q$ organic material commercially available from Puretemp LLC and having a melting temperature of 42° C.

For the investigations, a generalized thermal management performance test platform was developed based on a thermal test vehicle that permitted accurate control of not only heater power, but also the spatial and temporal power map across the chip, which allowed high power densities to be used. The thermal test vehicle was equipped with heaters for heating test chips that were approximately 21×21 mm in area. Platinum resistance temperature detectors (RTDs) were used to measure the temperature distribution across the internal surfaces of the test chips. An inter-integrated circuit ($I^2C$) addressable pulse width modulation (PWM) control board was used to individual control of the heaters. Interfacial loading between the heat sink devices and chips was also controlled for consistency and permit investigation into the effects of contact resistance between the devices and test chips. External natural convection effects were minimized to better match the conditions of operation in a small enclosure, such as a case of a portable electronic device.

Prior to the start of the investigation, the masses of the empty heat sink devices and the masses of the heat sink devices after being filled with their PCMs were recorded. The interfacial load value for all tests is about 69 kPa (about 10 psi) and remained constant for all tests. Heat fluxes of about 6.8 to about 14.5 W cm$^{-2}$ are evaluated in single-shot heating and cyclic heating tests. The test power cycles were designed to operate like an active thermal throttling scheme, commonly employed in electronics, allowing processors to exceed typical clock speeds for a short period of time (surge processing) until the chip temperature rises above a specified limit. When the chip surpassed the cut-off temperature, $T_{cut-off}$, the power was reduced to keep the processor at a safe operating temperature. Once the temperature dropped below a lower temperature set point, the processor is allowed to return to high-power operation again. In this investigation, $T_{cut-off}$ was set at 95° C. to avoid damage to the test equipment and the temperature to allow a high-power cycle to restart was set at 30° C. Five thermal cycles was chosen to capture the behavior of the heat sink design and PCM combinations, which showed the nature of the melt and regeneration behavior during operation.

After ensuring that each test started from a steady state ambient condition, power was supplied to the heaters at the specified levels for each location. Heating continued until the maximum chip temperature increased above 95° C. At that point, the power to the heaters was shut off to allow the chips and devices to cool naturally via heat spreading and dissipation through the test equipment. Temperatures were monitored continuously throughout all phases of the test to capture both melting and regeneration behavior. When all chip temperatures decreased below 30° C., the heaters were turned back on and the heating/cooling period repeated unless the desired number of test cycles had been reached, in which case the devices were allowed to continue to cool naturally back to the ambient starting temperature to complete the test.

Figure 3:
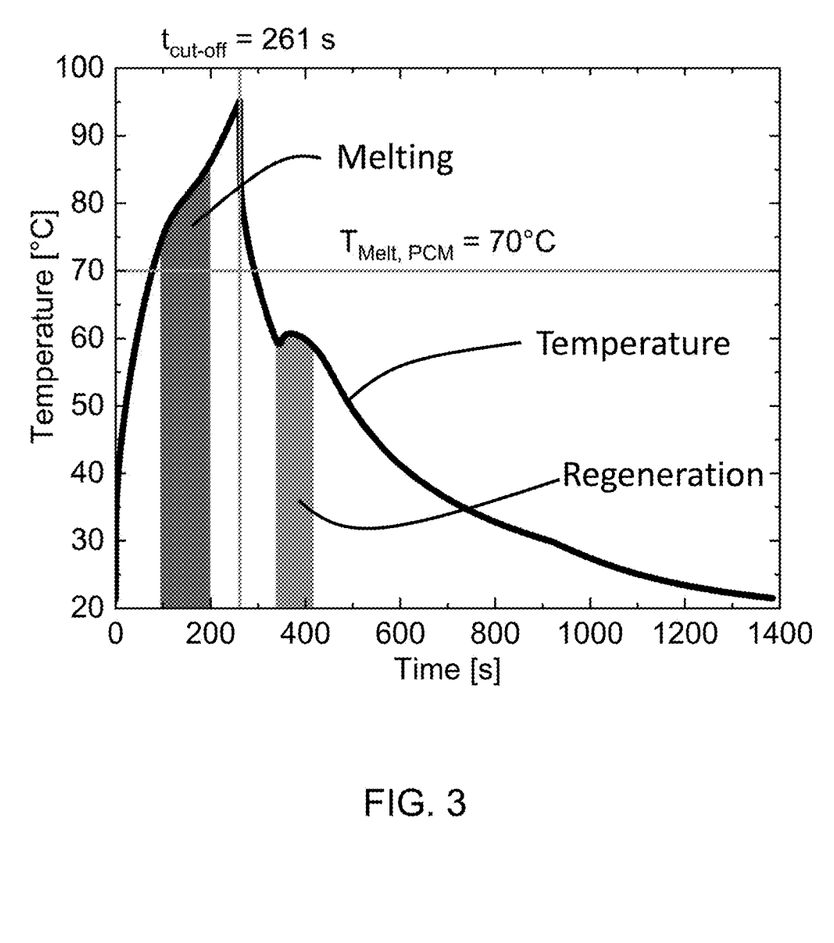
FIG. 3 is a graph representing a temperature evolution for the isokite device of FIG. 2 filled with a PCM and subjected to a heat flux of 7.5 W cm$^{-2}$. Temporal regions during melting and regeneration and the time to reach a cut-off temperature ($t_{cut-off}$) of 70° C. are identified.

Baseline tests (without PCM) were carried out on all seven heat sink devices shown in FIG. 2 to provide a comparison point for those devices with compartments after they were filled with PCM. Multiple tests were run for all baseline and PCM-filled tests, with the results averaged for each case. FIG. 3 shows the evolution of the chip temperature with respect to time during the test of the 50×50 mm isokite device containing the PlusICE® S70 PCM at a heat flux of 7.5 W cm$^{-2}$. The "Melting" region identifies melting during the heating phase, and the "Regeneration" regions identifies regeneration during cooling. Heating ceased once the maximum chip temperature reached 95° C. Due to the thermal resistance between the chip and the temperature of the PCM, melting appears to occur at a higher temperature than 70° C. This same phenomena was also observed during regeneration, with the apparent regeneration temperature depressed below the melting point during cooling. However, there was minor sub-cooling observed as shown by the small peak in FIG. 3 during solidification. This peak occurred because sub-cooling allowed the PCM temperature to reach a temperature below the phase change temperature of the PCM. Upon the initiation of regeneration, the PCM released the latent energy stored during melting to undergo a liquid-to-solid change of phase. This release of energy meant that the increase in heat flow from the device, through the chip, caused the internal chip temperature to rise again resulting in a small temperature peak associated with sub-cooling during regeneration.

Figure 4:
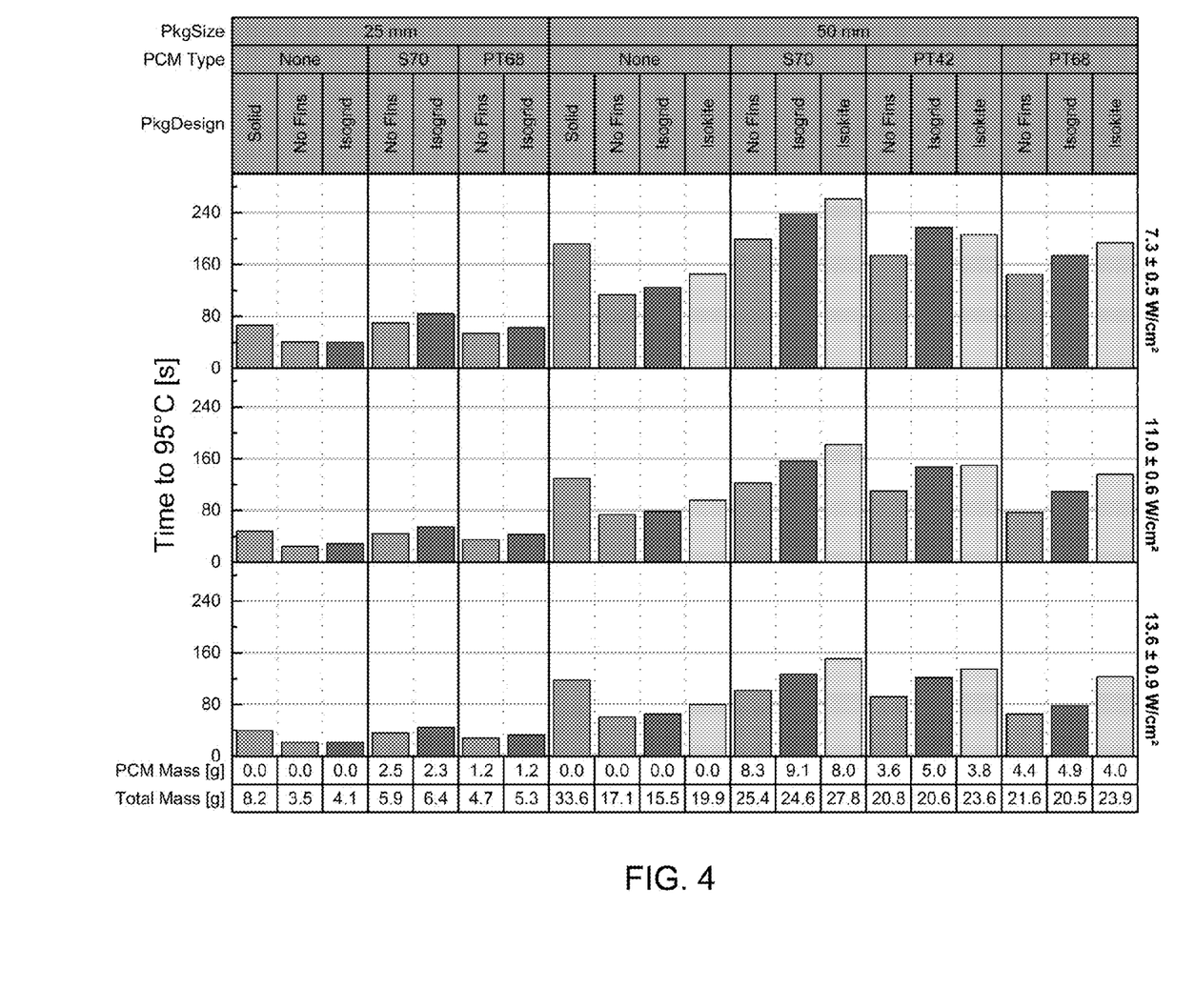

FIG. 4 shows the time to 95° C. for the different devices and power levels. As a guide to interpreting the results, first consider a single device size, PCM type, and power level, for instance, the 50 mm device with PureTemp® 68 ("PT68") PCM at about 7.3 W cm$^{-2}$ shown in the top right corner of the chart. As predicted, the addition of fins ("Isogrid" and "Isokite" devices) significantly enhanced the conduction pathways through the PCM and improved the performance (i.e., the time to 95° C.) of the device. Additionally, the Isokite devices, having a higher surface area to volume ratio, generally performed better than the finless or Isogrid devices in all test cases except for the PureTemp® 42 ("PT42") PCM at the lowest heat flux level. The PT42 material used in the Isogrid design had better performance than the PT42 material used in the Isokite design for the lowest heat flux level, but this result did not hold at higher heat fluxes due to the interplay between melting timescale and heating rate. At the lower heat flux, the PT42 material was able to accommodate a heating load of about 7.3 W cm$^{-2}$ and had a longer period over which to absorb the thermal energy. In the case of the PT42 material used in the Isokite design at the same heat flux of 7.3±0.5 W cm$^{-2}$, the PCM was fully exhausted long before the cut-off temperature was reached. Therefore, it is beneficial for the device to have the extra volume of PCM allowed by the Isogrid design. At higher heat fluxes, the energy absorption of the PT42 material could not keep pace with the heating rate, thus the latent heat of the PCM was not exhausted prior to the chip reaching the $T_{cut-off}$, which rendered the surplus PCM volume in the Isogrid device useless. The trade-off between the enhanced response of the Isokite device and the added PCM capacity of the Isogrid device should be considered during device design for a specific operating load and material combination.

Figure 5:
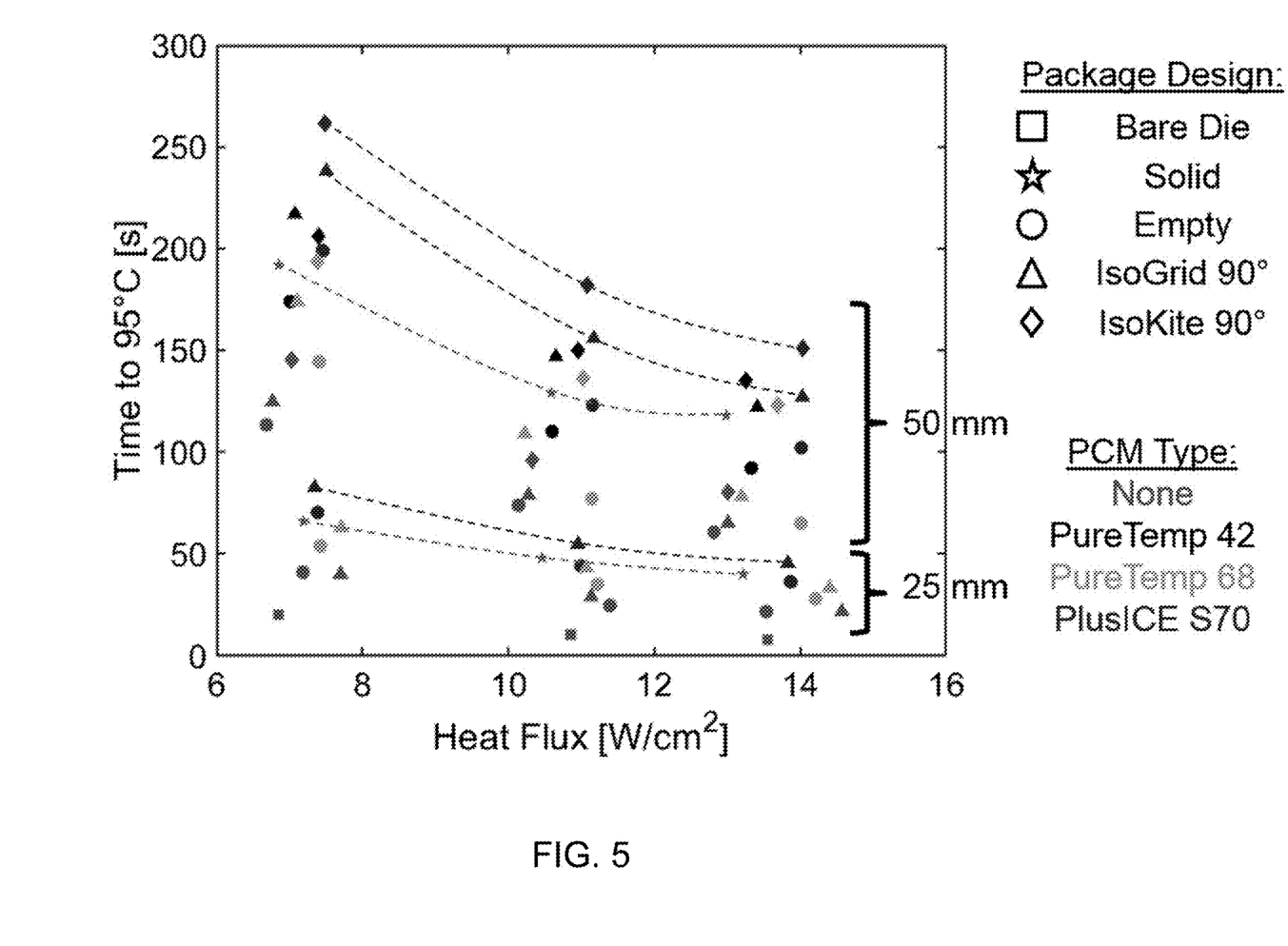

When considering the performance of a single device size and type while increasing the heat flux, the time to 95° C. can be seen to decrease with increasing heating rate. While FIG. 4 provides detailed information about the performance of all the different device designs and material combinations at each heat flux level, quantitative trends are not immediately clear. FIG. 5 provides an overview of the performance trends for each device and PCM combination as the heat flux was increased. It can be noted that the performance of the individual devices converge as the heat flux increases. This was expected due to the rate at which the PCM can accept heat from the chip. It is clear from FIGS. 4 and 5 that increasing surface area and decreasing each compartment depth (thickness) resulted in a faster and more effective response for the PCM composite heat exchanger. Additionally, the convergence of designs with increasing heat flux highlights the impact that increased power loads have on enhancement features and PCM selection. This further emphasizes the importance of a tunable device to permit easy design modifications for high power systems.

Figure 6:
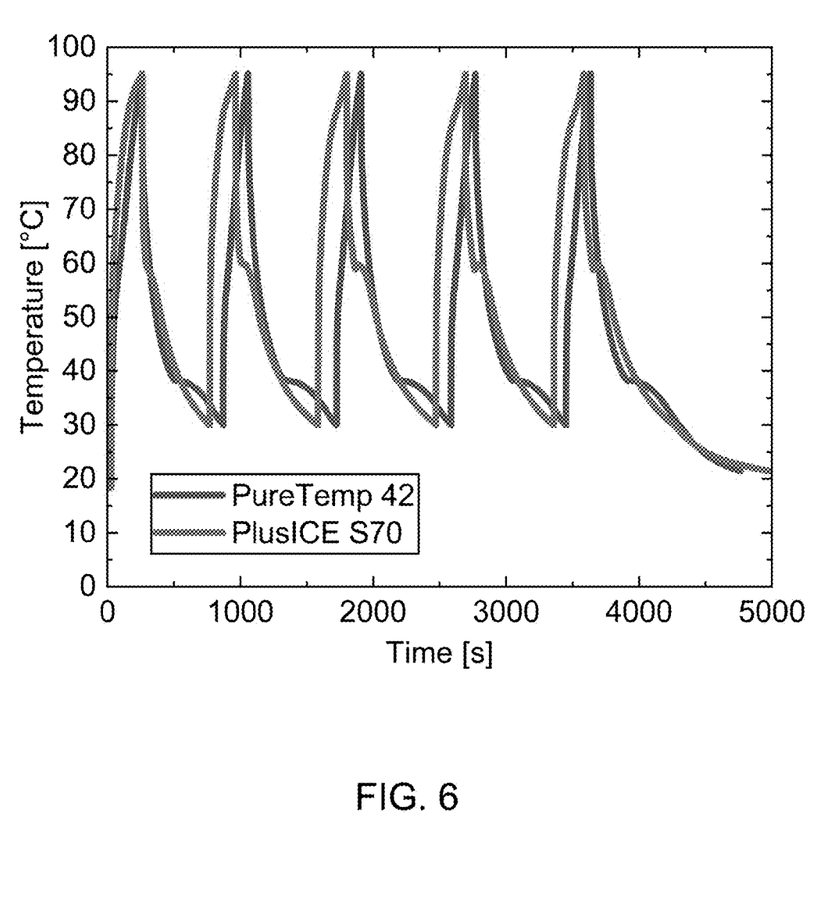
FIG. 6 represents the temperature evolution during several cycles of heating for the isokite devices containing the PlusICE® S70 and PureTemp® 42 PCMs. Repeated cycling of the devices during testing revealed that while short-term gains can be achieved with the lower-melting PureTemp® 42 PCM, it was difficult to fully regenerate in subsequent cycles due to elevated operating temperatures.

Another consideration is the melting temperature itself, as observed by comparing the PureTemp® 42 and PureTemp® 68 results. The thermophysical properties, except melting temperature, were very similar for these two materials, but PureTemp® 42 provided a longer operating time before reaching 95° C. than PureTemp® 68 due to a lower melting point (42° C.). While this may be advantageous during a heating cycle, the impact on the regeneration phase must be considered. A lower melting point requires a longer cooling time before full regeneration occurs thus requiring a longer regeneration period than PureTemp® 68 with its higher melting temperature (68° C.). Therefore, if the operating conditions require infrequent surges of thermal energy to be buffered, a PCM with a lower melting temperature can provide a longer time to reach $T_{cut-off}$ than a material with a higher melting temperature, provided all other thermophysical properties are comparable. However, as the cycling tests show in FIG. 6, cases requiring regular thermal cycles would benefit more from a higher melting temperature which decreases the regeneration time and results in a shorter total cycle period (melting and regeneration) than from a slightly longer time to $T_{cut-off}$.

In all cases, the salt hydrate PCM (PlusICE® S70) performed better than the organic PCMs. This result was attributed to the higher cooling figure of merit for the salt hydrate PCM compared to the organic PCMs. Salt hydrate materials have a propensity for sub-cooling during regeneration. Sub-cooling, or the delay of the phase transition from liquid to solid beneath the melting temperature, can be an issue for cycling of salt hydrate PCMs and must be investigated to determine if the augmented performance of a salt hydrate PCM comes at a high price during regeneration.

The regeneration portion of the thermal cycle is important for the operation of heat sink devices that utilize a PCM. The desired behavior of a PCM during cycling allows the heat to be absorbed quickly and effectively into the available PCM volume, which allows complete melting to take place and provides maximum energy storage during a dynamic heating event. However, it is also important for the PCM to effectively reject the stored thermal energy after heating to allow rapid cooling beneath the melting temperature which permits the liquid to solidify and be ready to absorb more thermal energy during the next heating cycle. If a PCM experiences sub-cooling, the regeneration process can be delayed and the cycle period extended. The PlusICE® S70 material is reported to be specifically formulated to include nucleation-promoting components which minimize the degree of sub-cooling. During the cycle tests of PlusICE® S70, a sub-cooling of less than 5° C. was observed in all cases, as is highlighted by the small dip and peak during its regeneration stage shown in FIG. 6. No degradation in the behavior of the material was observed during the course of the experiments.

In view of the above, the investigation provided a comparison of the performances of heat sink devices formed to have internal fins, along with the effects of different PCMs contained within compartments formed by the fins. The results indicated the influence of a PCM depends in part on the combination of the thermal conduction pathways formed by the fins and the energy storage volumes provided by the compartments. In some cases, the integration of a PCM can degrade system performance. However, the evaluated heat sink devices indicated that improved performance can be achieved with compartments defined by fins arranged in an isogrid pattern and particularly an isokite pattern, with performance being further enhanced with a salt hydrate PCM. In the reported investigation, the combination of an isokite device and a salt hydrate PCM extended the time to reach 95° C. by 36.2% compared to the solid heat sink device when both were tested at a heat flux of 7.5 W cm$^{-2}$. The isokite device achieved this performance advantage while weighing 17.3% less than the solid aluminum control device due to the lower density of the PCM in comparison to 6061 aluminum. This weight savings would be helpful in consumer portable electronics, and can be critical when considering the use of PCM thermal management of electronics in aerospace platforms.

The highly-configurable heat sink devices described above also allow for the use of one or more standardized external device sizes that can be established early in the development of a thermal management system for a particular application, for example, a portable electronic device, or at the conceptual design phase of mission planning for an aerospace platform/mission. The ability for early definition of a dedicated volume facilitates favorable positioning of the heat sink device within a thermal management system for a device, while allowing continued development of the internal structure of the device to adapt to other changes in the design cycle for the device. The designer can optimize the layout of the heat sink device for specific power maps or thermal requirements of individual chip families or specific power map.

Another aspect of the heat sink devices is that not all compartments within the device need to be the same depth. A compartment with a shallower depth can be advantageously used for high-power density regions of chips because a thicker base acts as a heat spreader. Additionally, the thickness of an isostructure (fin or wall) can be increased in areas of high heat flux to promote enhanced local heat spreading. These techniques for localized heat spreading boost design performance without requiring all of the walls or the entire base of the device to be thicker, which would significantly reduce the available volume of PCM within the compartments of the device. In extreme cases, where a region of heat flux is high enough that the PCM will not have time to change phase prior to a chip (or other heat load) reaching a thermal cut-off temperature, a portion of the device can be defined as a solid body, providing a continuous high-conductivity path from the chip to a rejection surface of the device. This spreading path can be capable of quickly removing heat from a chip while still providing the benefit of latent heat storage within the PCM in a remaining volume of the device.

In addition to the design benefits of localized heat spreaders, the volumes and shapes of the compartments can be optimized to a specific power map for a given application. Radial spreading troughs (FIG. 1B) promote uniform heat spreading throughout the device, while maximizing the total volume of PCM available for latent heat storage. Since the compartments are discrete, multiple different PCMs may be employed within the same heat sink device without concerns of mixing or sedimentation between PCMs.

In view of the above, the present invention broadly encompasses (though is not limited to) heat sink devices whose geometries are able to augment the performance of PCMs by reducing the heat transfer resistance from a heat load to the center of a volume of a PCM, thereby achieving faster response times to surge power demands while maintaining adequate heat spreading throughout the device. Furthermore, such a heat sink device is tunable to various different power maps and applications by changing the distribution of the enhancement structures and PCM within the internal compartments of the device.

While the invention has been described in terms of particular embodiments and investigations, it should be apparent that alternatives could be adopted by one skilled in the art. For example, heat sink devices and their components could differ in appearance and construction from the embodiments described herein, functions of certain components of the devices could be performed by components of different construction but capable of a similar (though not necessarily equivalent) function, process and performance parameters could be modified, and appropriate materials could be substituted for those noted. As such, it should be understood that the above detailed description is intended to describe particular embodiments and certain but not necessarily all features and aspects thereof, and to identify certain but not necessarily all alternatives to the embodiments and their described features and aspects. As a nonlimiting example, the invention encompasses additional or alternative embodiments in which one or more features or aspects of a particular embodiment could be eliminated or two or more features or aspects of different embodiments could be combined. Accordingly, it should be understood that the invention is not necessarily limited to any embodiment described herein or illustrated in any drawing, and the phraseology and terminology employed above are for the purpose of describing the disclosed embodiments and investigations and do not necessarily serve as limitations to the scope of the invention. Therefore, the scope of the invention is to be limited only by the following claims.

The invention claimed is:

1. A heat sink device comprising:
   a base wall;
   a top wall spaced apart from the base wall;
   an internal structure between and in intimate thermal and physical contact with the base wall and the top wall, the internal structure comprising multiple compartments defined and separated by fins that extend between the base and top walls, the fins serving as thermal enhancement structures to augment the surface area to volume ratio of the heat sink device; and
   phase change materials (PCMs) sealed within at least some of the compartments and at least two of the compartments containing different PCMs.

2. The heat sink device according to claim 1, wherein the compartments have different volumes.

3. The heat sink device according to claim 1, wherein the internal structure is an isogrid internal structure and the compartments have triangular shapes.

4. The heat sink device according to claim 3, wherein the fins of the isogrid internal structure comprise radial fins.

5. The heat sink device according to claim 1, wherein the internal structure is an isokite internal structure and the compartments have deltoid shapes.

6. The heat sink device according to claim 5, wherein the fins of the isokite internal structure comprise radial and non-radial fins.

7. The heat sink device according to claim 1, wherein the compartments are primary compartments and the device further comprises secondary compartments surrounding the primary compartments.

8. The heat sink device according to claim 7, wherein the secondary compartments contain an additional quantity of at least one of the PCMs.

9. The heat sink device according to claim 7, wherein the secondary compartments have trapezoidal shapes.

10. The heat sink device according to claim 7, wherein the secondary compartments are defined by multiple radial fins between and in intimate thermal and physical contact with the base wall and the top wall.

11. The heat sink device according to claim 10, wherein the secondary compartments contain an additional quantity of at least one of the PCMs.

12. The heat sink device according to claim 10, wherein the secondary compartments have trapezoidal shapes.

13. The heat sink device according to claim 7, wherein the device further comprises a central heat spreader formed by the base wall beneath the primary compartments.

14. The heat sink device according to claim 1, wherein the device further comprises a central heat spreader formed by the base wall beneath the compartments.

15. The heat sink device according to claim 1, wherein at least one of the base and top walls varies in thickness.

16. The heat sink device according to claim 1, wherein the PCMs are sealed within each of the compartments.

17. The heat sink device according to claim 1, wherein at least one of the PCMs is a salt hydrate material.

18. A method comprising using the heat sink device of claim 1 as a heat sink to dissipate heat from a heat load.

19. The method of claim 18, wherein the heat load is a chip of an electronic device.

\* \* \* \* \*